United States Patent [19]

Clark et al.

[11] Patent Number: 4,924,471
[45] Date of Patent: May 8, 1990

[54] METHOD FOR INCREASING THE OUTPUT POWER OF A LASER DIODE

[75] Inventors: John H. Clark, Wheaton; James H. Fisher, Aurora; Thomas Wolfram, Wheaton, all of Ill.

[73] Assignee: Amoco Corporation, Chicago, Ill.

[21] Appl. No.: 322,196

[22] Filed: Mar. 13, 1989

[51] Int. Cl.⁵ ............................................. H01S 3/04
[52] U.S. Cl. ........................................ 372/34; 372/43
[58] Field of Search ................. 372/34, 45, 43, 69, 372/36

[56] References Cited

U.S. PATENT DOCUMENTS

| | | | |
|---|---|---|---|
| 4,064,621 | 12/1977 | Lo | 372/45 |
| 4,399,541 | 8/1983 | Konvats | 372/36 |
| 4,701,928 | 10/1987 | Fan et al. | 372/69 |
| 4,809,291 | 2/1989 | Byer et al. | 372/34 |

Primary Examiner—Léon Scott, Jr.
Attorney, Agent, or Firm—Richard A. Kretchmer; William H. Magidson; Ralph C. Medhurst

[57] ABSTRACT

The optical output power from a GaInP based laser diode can be at least doubled by slight cooling of the device with thermoelectric cooling means when the diode is operated in a substantially room temperature environment.

16 Claims, 2 Drawing Sheets

METHOD FOR INCREASING THE OUTPUT POWER OF A LASER DIODE

FIELD OF THE INVENTION

This invention relates to a method for increasing the optical power of a GaInP based laser diode when the device is utilized in a substantially room temperature environment. More particularly, it relates to the use of thermoelectric cooling means to reduce the operating temperature of the laser diode below that of its environment.

BACKGROUND OF THE INVENTION

A laser is a device which has the ability to produce monochromatic, coherent light through the stimulated emission of photons from atoms, molecules or ions of an active medium which have typically been excited from a ground state to a higher energy level by an input of energy. Such a device contains an optical cavity or resonator which is defined by highly reflecting surfaces which form a closed round trip path for light, and the active medium is contained within the optical cavity.

If a population inversion is created by excitation of the active medium, the spontaneous emission of a photon from an excited atom, molecule or ion undergoing transition to a lower energy state can stimulate the emission of photons of substantially identical energy from other excited atoms, molecules or ions. As a consequence, the initial photon creates a cascade of photons between the reflecting surfaces of the optical cavity which are of substantially identical energy and exactly in phase. A portion of this cascade of photons is then discharged out of the optical cavity, for example, by transmission through one or more of the reflecting surfaces of the cavity. These discharged photons constitute the laser output.

Excitation of the active medium of a laser can be accomplished by a variety of methods. However, the most common methods are optical pumping, use of an electrical discharge, and the passage of an electric current through the p-n junction of a semiconductor laser.

Semiconductor lasers contain a p-n junction which forms a diode, and this junction functions as the active medium of the laser. Such devices are also referred to as laser diodes. The efficiency of such lasers in converting electrical power to output radiation is relatively high and, for example can be in excess of 40 percent.

Conventional laser diodes (as used herein, the term laser diode includes laser diode arrays) are available which produce output radiation having a wavelength over the range from about 630 to about 1600 nm. For example, the wavelength of the output radiation from a GaInP based device can be varied from about 630 to about 700 nm by variation of the device composition. Similarly, the wavelength of the output radiation from a GaAlAs based device can be varied from about 750 to about 900 nm by variation of the device composition, and InGaAsP based devices can be used to provide radiation in the wavelength range from about 1000 to about 1600 nm.

For the purposes of this application, the terminology "GaInP based laser diode" refers to any laser diode or laser diode array wherein the active medium of the device is comprised of at least one material selected from the group consisting of: (a) alloys of gallium, indium and phosphorus, and (b) alloys of gallium, indium, aluminum and phosphorus.

Laser diodes having an active layer consisting of either a GaInP alloy or a GaInAlP alloy, for example $Ga_{0.5}In_{0.5}P$, have the ability to produce visible light at a wavelength in the range from about 630 to about 700 nm, and more typically in the range from about 670 to about 700 nm when operated at a temperature of about 25° C. AlGaInP alloys, which can be lattice-matched to GaAs, have been used as cladding layers for GaInP alloy active layers. The preparation and operation of double-heterostructure GaInP based laser diodes on GaAs substrates have been reported as follows: (a) $Ga_{0.5}In_{0.5}P$ active layer and $Al_{0.2}Ga_{0.3}In_{0.5}P$ cladding layers, Kobayashi et al., *Electron. Lett.*, Vol. 21, No. 20, pp. 931–932 (26 Sept. 1985); (b) $Ga_{0.52}In_{0.48}P$ active layer and $Al_{0.26}Ga_{0.26}In_{0.48}P$ cladding layers, Ikeda et al., *Appl. Phys. Lett.*, Vol. 47, No. 10, pp. 1027–1028 (15 Nov. 1985); (c) $Ga_{0.5}In_{0.5}P$ active layer and $Al_{0.25}Ga_{0.25}In_{0.5}P$ cladding layers, Ishikawa et al., *Appl. Phys. Lett.*, Vol. 48, No. 3, pp. 207–208 (20 Jan. 1986) and Ikeda et al., *J. Cryst. Growth*, Vol. 77, pp. 380–385 (1986) and (d) $In_{0.5}(Al_{0.2}Ga_{0.8})_{0.5}P$ active layer and $In_{0.5}(Al_{0.9}Ga_{0.1})_{0.5}P$ cladding layers, Dallesasse et al., *Appl. Phys. Lett.*, Vol. 53, No. 19, pp. 1826–1828 (7 Nov. 1988).

Laser diodes respond to changes in temperature in a variety of ways. For example, the peak wavelength of near infrared GaAlAs devices can be varied by as much as about 5 or 10 nm simply by adjusting the temperature of the device over the temperature range from about 20° C. to about 50° C. In addition, the lifetime of a laser diode is a function of temperature. Indeed, the lifetime of such a device can decrease by an order of magnitude in response to a 40° C. rise in temperature. Finally, the power output of a laser diode at constant drive current is a function of temperature and will usually increase as the temperature is lowered. However, for a typical near infrared GaAlAs device operated at a constant drive current, this increase in power will generally be less than 1% per degree Centigrade. Thus, such a device, when operated at 0° C., would have an increase in output power of less than 25% when compared to the output power of the same device at 25° C. when operated at a constant drive current.

The above-cited Kobayashi et al. reference sets forth data for the described $Ga_{0.5}In_{0.5}P$ device illustrating optical output power versus DC and pulsed driving current at various temperatures over the range from 15° to 80° C. Similarly, the above-cited Ishikawa et al. reference sets forth data for the described $Ga_{0.5}In_{0.5}P$ device illustrating light output power versus DC driving current at various temperatures over the range from 24° to 51° C. Further, the above-cited Dallesasse et al. reference sets forth data for the described $In_{0.5}(Al_{0.2}Ga_{0.8})_{0.5}P$ device illustrating continuous (cw) light output versus current at various temperatures over the range from 20° to −30° C. In each case, a reduction in temperature resulted in increased output power at a given driving current. However, none of these references either teaches or suggests operating such a device in an environment having an ambient temperature in the range from about 10° to about 40° C. and simultaneously cooling the device thermoelectrically during such operation by an amount which is sufficient to at least double its power output relative to that obtained at ambient temperature and constant drive current.

U.S. Pat. No. 3,840,889 (O'Brien et al., Oct. 8, 1974) is directed to a laser diode device which has a low inherent inductance when operated at high frequencies. It is disclosed that it may be necessary to lower the temperature of the laser diode to an operating temperature below that of room temperature in order to operate the diode at a low threshold current.

U.S. Pat. No. 4,238,759 (Hunsperger, Dec. 9, 1980) is directed to a Peltier-cooled laser diode wherein the cooling junction is located within a few microns of the active layer of the diode. This reference teaches that, in semiconductor lasers, temperature is a limiting factor for line width, wavelength stability, operating lifetime and threshold current. It is further disclosed that the wavelength of the laser output radiation can be tuned by temperature variation.

U.S. Pat. No. 4,315,225 (Allen, Jr. et al., Feb. 9, 1982) discloses that semiconductor laser diodes have been operated to yield a continuous output of as much as 40 mW at room temperature with much higher powers being obtained at lower temperatures.

U.S. Pat. Nos. 4,338,577 (Sato et al., July 6, 1982) and 4,604,753 (Sawai, Aug. 5, 1986) both teach the combination of a laser diode with a thermoelectric heat pump and disclose that the optical output power from the diode decreases with an increase in temperature.

SUMMARY OF THE INVENTION

We have discovered that the optical output power from a GaInP based laser diode can be at least doubled by slight cooling of the device with thermoelectric cooling means when the diode is operated in a substantially room temperature environment.

One embodiment of the invention is a method for increasing the optical output power of a GaInP based laser diode which comprises: (a) placing said diode in an environment having an ambient temperature in the range from about 10° to about 40° C.; (b) cooling said diode with thermoelectric cooling means to an operating temperature which is lower than said ambient temperature; and (c) operating said diode in said environment at said operating temperature, wherein said operating temperature is effective to increase the optical output power of said diode by at least 100% relative to the output power of said diode when measured at said ambient temperature and a constant driving current.

An object of the invention is to provide a relatively high-power laser diode source of visible red light.

Another object of the invention is to provide a method for substantially increasing the optical output power of a GaInP based laser diode.

Another object of the invention is to provide an improved method for operating a GaInP based laser diode in a substantially room temperature environment.

A further object of the invention is to provide a method for adjusting and controlling the optical output power of a GaInP based laser diode.

DETAILED DESCRIPTION OF THE PREFERRED EMBODIMENTS

Figure 1:
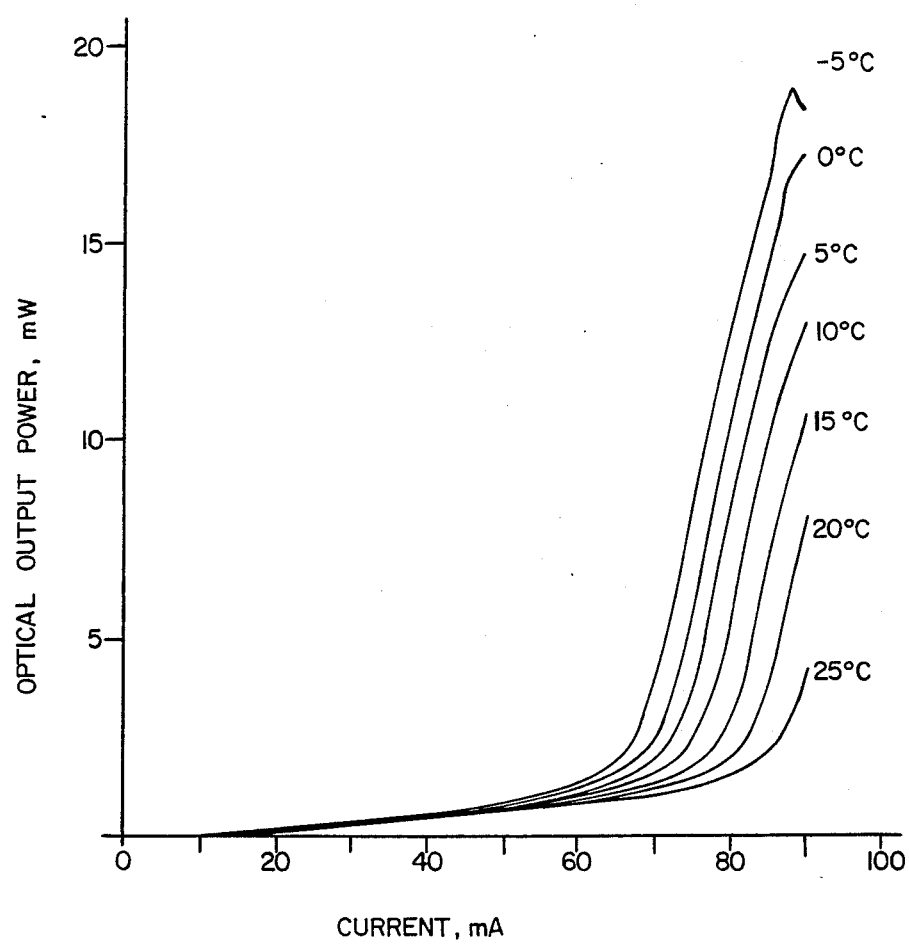
FIG. 1 of the drawings is a graph which illustrates the light output of a typical GaInP based laser diode as a function of driving current at various temperatures over the range from −5° to 25° C.

GaInP based laser diodes are normally operated at a temperature which is at or slightly above room temperature. For example, in the range from about 15° to about 35° C. and typically at about 25° C. However, we have found that the optical output power obtained from such a device is an extremely sensitive function of temperature at temperatures near that of room temperature. This relationship between output power and temperature is illustrated in FIG. 1 for a conventional double-heterostructure GaInP based laser diode which: (a) has an active layer composed of a GaInP alloy and cladding layers composed of an AlGaInP alloy; and (b) produces visible red output radiation at a wavelength of about 684 nm.

With reference to FIG. 1, it will be seen that the output power of the GaInP based laser diode is 2.2 milliwatts when operated with a driving current of 85 milliamperes at a temperature of 25° C. However, if the operating temperature is lowered to −5° C., the output power increases to 16.5 milliwatts at the same driving current. This represents a 650% power increase which is achieved merely by reducing the diode operating temperature by 30° C. Similarly, a 210% power increase can be achieved by a temperature reduction of only 10° C. using operation at 25° C. and a constant driving current of 85 milliamperes as a basis for comparison.

In view of the enormous temperature sensitivity of the output power of a GaInP based laser diode at temperatures near that of ordinary room temperature or about 25° C., we have found that the operation of such a device can be substantially improved by combining it with a thermoelectric cooling means and operating it at a temperature which is slightly below that of the ambient temperature of the environment in which the device is operated. Suitable ambient environmental temperatures for use in the practice of this invention range from about 10° to about 40° C., but are more typically in the range from about 15° C. to about 35° C.

The thermoelectric cooling means is utilized to cool the laser diode by an amount which is effective to increase its optical output by at least 100% and preferably by at least 200% relative to the output power obtainable at the ambient environmental temperature and a constant driving current. The difference between the environmental temperature and the operating temperature is desirably less than about 30° C., preferably less than about 20° C., and can frequently be less than about 10° C. By simply adjusting and controlling the operating temperature of the laser diode in this manner, the optical output power of the diode can be adjusted and controlled over an extremely wide range.

Figure 2:
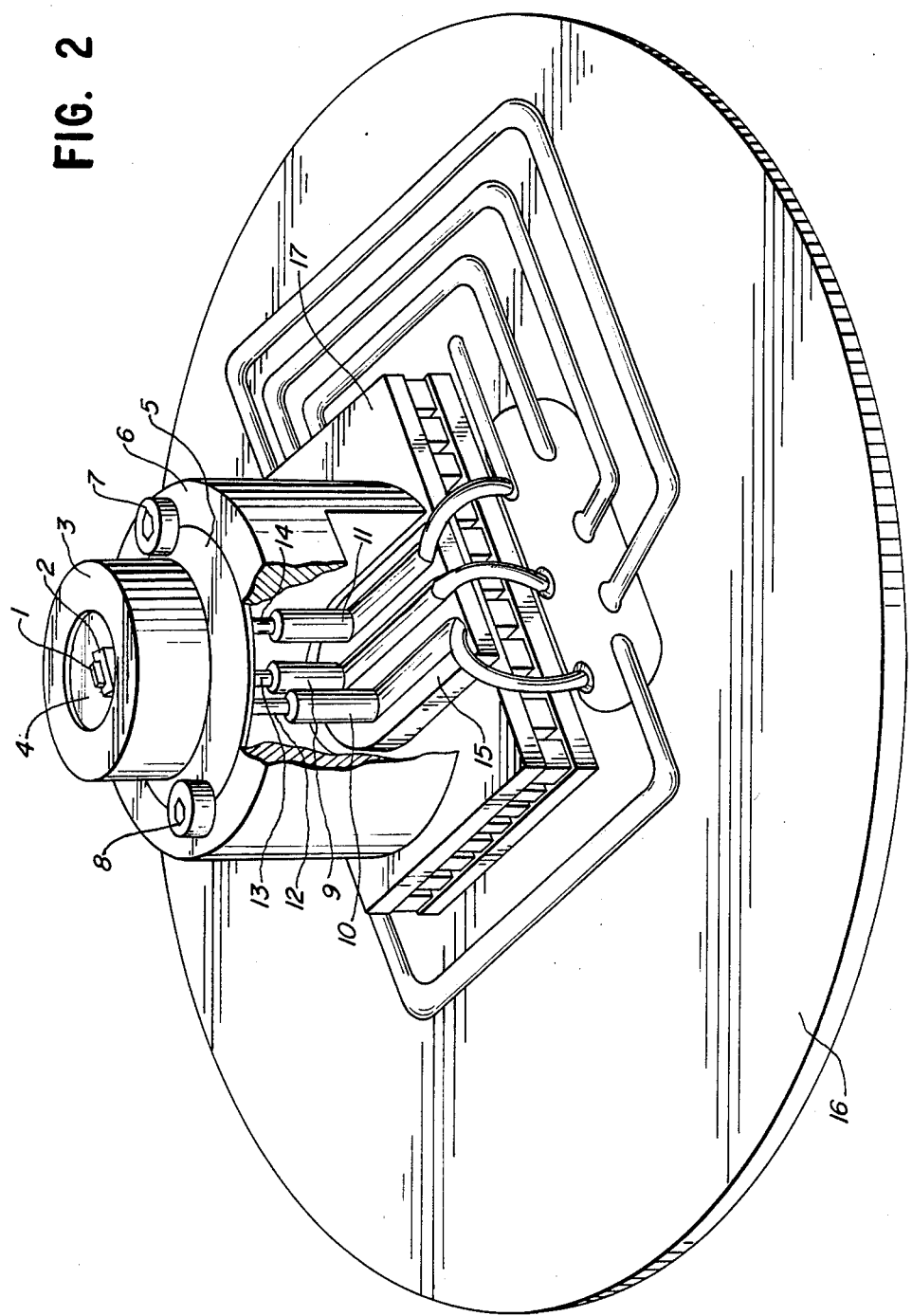
FIG. 2 of the drawings is a perspective view, partly in section, of a combination of laser diode and thermoelectric cooler which is suitable for use in the practice of this invention.

FIG. 2 of the drawings illustrates a combination of GaInP based laser diode with thermoelectric cooling means which is suitable for use in the practice of this invention. With reference to FIG. 2, the laser diode 1 is mounted on a heat conducting header or mounting block 2 within a metal housing 3 which is provided with a transparent window 4 through which output radiation from laser diode 1 is transmitted. The flange 5 on housing 3 is attached to heat sink 6 by fastening means 7 and 8. Sockets 9, 10 and 11 receive electrical leads or pins 12, 13 and 14 through which driving current from circuit boards 15 and 16 is transmitted to laser diode 1 via electrical conductors which are not shown. The operating temperature of laser diode 1 is controlled by thermoelectric cooling means 17 which is in direct contact with and cools heat sink 6. Laser diode 1 is in thermal contact with cooling means 17 through heat sink 6 and mounting block 2. Electrical power for the operation of thermoelectric cooling means 17 is provided through circuit board 16. The operating temperature of laser diode 1 is sensed by temperature sensing means (which is not shown), for example a thermocouple or thermistor, and the signal from the temperature sensing means can be used, if desired, as a basis for adjustment and control of cooling means 17 by conventional techniques.

Any GaInP based laser diode can be used in the practice of this invention. However, those emitting visible red radiation having a wavelength in the range from about 660 to about 700 nm when operated at a temperature of 25° C. are preferred because of the wide range of applications for laser radiation having a frequency in this range. Conventional double-heterostructure GaInP based laser diodes, which comprise cladding layers of at least one alloy of aluminum, gallium, indium and phosphorus (Al, Ga, In and P), are highly suitable for use in the practice of this invention, and such cladding layers can be either n-doped or p-doped. For example, a conventional laser diode with an active layer having a stoichiometry of about $Ga_{0.5}In_{0.5}P$ and cladding layers having a stoichiometry of about $Al_{0.25}Ga_{0.25}In_{0.5}P$ is suitable for use in the practice of this invention.

Thermoelectric cooling means suitable for use in the practice of this invention include all conventional cooling devices which operate by the direct interconversion of heat and electrical energy. A review of thermoelectric energy conversion by A. C. Glatz is set forth at pp. 900–917 in the Kirk-Othmer Encyclopedia of Chemical Technology, Third Ed., Vol. 22, John Wiley & Sons, N.Y. (1983).

In a preferred embodiment of the invention, the thermoelectric cooling means is used to maintain the GaInP based laser diode at a substantially constant operating temperature in order to maintain the output radiation at a substantially constant wavelength. For example, the operating temperature is desirably maintained within about ±1.0° C. or preferably within about ±0.5° C. of the selected value.

We claim:

1. A method for increasing the optical output power of a GaInP based laser diode which comprises:
   (a) placing said diode in an environment having an ambient temperature in the range from about 10° to about 40° C.;
   (b) cooling said diode with thermoelectric cooling means to an operating temperature which is lower than said ambient temperature; and
   (c) operating said diode in said environment at said operating temperature, wherein said operating temperature is effective to increase the optical output power of said diode by at least 100% relative to the output power of said diode when measured at said ambient temperature and a constant driving current.

2. The method of claim 1 wherein said operating temperature is effective to increase the optical output power of said laser diode by at least 200% relative to the output power of said diode when measured at said ambient temperature and a constant driving current.

3. The method of claim 1 wherein said ambient temperature is in the range from about 15° to about 35° C.

4. The method of claim 1 wherein said ambient temperature is about 25° C.

5. The method of claim 1 wherein said laser diode produces output radiation having a wavelength in the range from about 660 to about 700 nm when operated at a temperature of 25° C.

6. The method of claim 1 wherein said laser diode has an active layer which is comprised of an alloy of gallium, indium and phosphorus.

7. The method of claim 6 wherein said laser diode is a double-heterostructure which comprises cladding layers of at least one alloy of Al, Ga, In and P.

8. The method of claim 7 wherein the cladding layers of said laser diode have a stoichiometry of about $Al_{0.25}Ga_{0.25}In_{0.5}P$.

9. The method of claim 8 wherein the active layer of said laser diode has a stoichiometry of about $Ga_{0.5}In_{0.5}P$.

10. The method of claim 1 wherein said laser diode has an active layer which is comprised of an alloy of gallium, indium, aluminum and phosphorus.

11. The method of claim 1 wherein said operating temperature is substantially constant.

12. The method of claim 11 wherein said operating temperature is maintained within about ±0.5° C. of the selected value.

13. The method of claim 1 wherein the difference between said ambient and operating temperatures is less than about 30° C.

14. The method of claim 1 wherein the difference between said ambient and operating temperatures is less than about 20° C.

15. The method of claim 1 wherein the difference between said ambient and operating temperatures is less than about 10° C.

16. The method of claim 1 which additionally comprises adjusting and controlling the optical output power of said laser diode by adjusting and controlling said operating temperature.

* * * * *

UNITED STATES PATENT OFFICE
CERTIFICATE OF CORRECTION

Patent No. 4,924,471            Dated May 8, 1990

Inventor(s) John H. Clark, James H. Fisher and Thomas Wolfram

It is certified that error appears in the above-identified patent and that said Letters Patent is hereby corrected as shown below:

Column 2, line 14, "$_5In_{0.5}P$" should read --$_5In_{0.5}P$--.

Column 2, line 20, "$_{25}In_{0.5}P$" should read --$_{25}In_{0.5}P$--.

Column 2, line 24, "$_9Ga_{0.1})_{0.5}P$" should read --$_9Ga_{0.1})_{0.5}P$--.

Column 2, line 55, "$_2Ga_{0.8})_{0.5}P$" should read --$_2Ga_{0.8})_{0.5}P$--.

Column 6, line 29, "$_5Ga_{0.25}In_{0.5}P$" should read --$_5Ga_{0.25}In_{0.5}P$--.

Column 6, line 32, "$_5In_{0.5}P$" should read --$_5In_{0.5}P$--.

Signed and Sealed this

Twenty-first Day of July, 1992

Attest:

DOUGLAS B. COMER

*Attesting Officer*       *Acting Commissioner of Patents and Trademarks*